United States Patent
Tomoda et al.

(10) Patent No.: US 11,659,654 B2
(45) Date of Patent: May 23, 2023

(54) STRETCHABLE WIRING BOARD

(71) Applicant: Murata Manufacturing Co., Ltd., Nagaokakyo (JP)

(72) Inventors: Takahito Tomoda, Nagaokakyo (JP); Shinsuke Tani, Nagaokakyo (JP); Takaaki Miyasako, Nagaokakyo (JP); Takayuki Okada, Nagaokakyo (JP); Yui Nakamura, Nagaokakyo (JP); Hayato Katsu, Nagaokakyo (JP); Keisuke Nishida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/238,898

(22) Filed: Apr. 23, 2021

(65) Prior Publication Data

US 2021/0243891 A1 Aug. 5, 2021

Related U.S. Application Data

(63) Continuation of application No. PCT/JP2019/039604, filed on Oct. 8, 2019.

(30) Foreign Application Priority Data

Dec. 27, 2018 (JP) .............................. JP2018-245483

(51) Int. Cl.
*H05K 1/02* (2006.01)
*H05K 1/09* (2006.01)
(Continued)

(52) U.S. Cl.
CPC ............ *H05K 1/0283* (2013.01); *H05K 1/181* (2013.01); *H05K 3/46* (2013.01); *H05K 1/092* (2013.01); *H05K 1/11* (2013.01)

(58) Field of Classification Search
CPC ........ H05K 1/0283; H05K 1/181; H05K 3/46; H05K 3/4685
See application file for complete search history.

(56) References Cited

U.S. PATENT DOCUMENTS

| 3,560,256 A | 2/1971 | Abrams |
| 3,806,629 A * | 4/1974 | Cocca ................. H05K 3/4685 257/776 |

(Continued)

FOREIGN PATENT DOCUMENTS

| JP | S5948991 A | 3/1984 |
| JP | H01-93771 U | 6/1989 |

(Continued)

OTHER PUBLICATIONS

Japanese Office Action issued for Japanese Application No. 2020-562374, dated Aug. 3, 2021.

(Continued)

*Primary Examiner* — Ishwarbhai B Patel
(74) *Attorney, Agent, or Firm* — ArentFox Schiff LLP (57) ABSTRACT

A stretchable wiring board that includes: a stretchable substrate; a first wiring line on the stretchable substrate; an insulating layer overlapping a first part of the first wiring line in a plan view of the stretchable wiring board; and a second wiring line overlapping the first part of the first wiring line in the plan view with the insulating layer interposed therebetween. The insulating layer has at least one first notch, and in the plan view, the at least one first notch does not overlap the first wiring line and overlaps the second wiring line.

12 Claims, 6 Drawing Sheets

(51) Int. Cl.
*H05K 1/18* (2006.01)
*H05K 3/46* (2006.01)
*H05K 1/11* (2006.01)

(56) References Cited

U.S. PATENT DOCUMENTS 4,000,054 A * 12/1976 Marcantonio ......... H01L 21/707
204/192.15
2016/0150641 A1 5/2016 Yoo

FOREIGN PATENT DOCUMENTS

| | | |
|---|---|---|
| JP | 2005119071 A | 5/2005 |
| JP | 2012033674 A | 2/2012 |
| JP | 2015119071 A | 6/2015 |
| JP | 2018107208 A | 7/2018 |

OTHER PUBLICATIONS

International Search Report issued for PCT/JP2019/039604, dated Dec. 3, 2019.
Written Opinion of the International Searching Authority issued for PCT/JP2019/039604, dated Dec. 3, 2019.
Japanese Office Action issued for JP Application No. 2020-562374, dated Mar. 23, 2021.

* cited by examiner

STRETCHABLE WIRING BOARD

CROSS REFERENCE TO RELATED APPLICATIONS

The present application is a continuation of International application No. PCT/JP2019/039604, filed Oct. 8, 2019, which claims priority to Japanese Patent Application No. 2018-245483, filed Dec. 27, 2018, the entire contents of each of which are incorporated herein by reference.

FIELD OF THE INVENTION

The present invention relates to a stretchable wiring board.

BACKGROUND OF THE INVENTION

In recent years, it has been practiced to manage a state of the human body and the like by acquiring and analyzing biological information.

For example, as described in Patent Document 1, a stretchable wiring board in which a stretchable substrate is attached to a living body and used is known.

In the stretchable wiring board described in Patent Document 1, a non-stretchable film substrate is overlapped with a portion connected to an external device.

Because a wiring line is arranged across both the stretchable substrate and the non-stretchable film substrate, stress is applied at a boundary between the two substrates during stretching. This stress can be relaxed by providing a notch or rounded part in the film substrate.

When a plurality of wiring lines are arranged on the board, the wiring lines may intersect each other. Patent Document 2 describes a thick film integrated circuit constituted by forming a lower layer conductor on an insulating board, forming an insulating layer on the lower layer conductor, and further forming an upper layer conductor intersecting the lower layer conductor on the insulating layer.

Patent Document 1: Japanese Patent Application Laid-Open No. 2018-107208

Patent Document 2: Japanese Utility Model Application Laid-Open No. H01-93771

SUMMARY OF THE INVENTION

Also in the stretchable wiring board, a plurality of wiring lines may be arranged on the board to make the wiring lines three-dimensionally intersect each other, but the wiring lines are required not to be short-circuited when the wiring lines intersect each other three-dimensionally. Further, when the stretchable wiring board is stretched at a portion where the wiring lines intersect each other, the wiring lines, particularly the upper wiring line, may be broken.

In Patent Document 1, the substrate near an external connection terminal needs to be hardened, and by providing a notch or rounded part in the film substrate, the wiring line that extends over the hard substrate and the soft substrate is prevented from being broken. However, this notch or rounded part is not intended to suppress the upper wiring line from being broken in the wiring lines that three-dimensionally intersect each other.

Further, Patent Document 2 does not mention a substrate having stretchability, and is not intended to prevent a wiring line from being broken when the substrate is stretched.

The present invention has been made to solve the above problems, and it is an object of the present invention to provide a stretchable wiring board in which, when two wiring lines are arranged so as to overlap each other, the wiring lines are prevented from being short-circuited, as well as suppressing breakage and deterioration in resistivity of the wiring lines during stretching.

A stretchable wiring board according to the present invention includes: a stretchable substrate; a first wiring line on the stretchable substrate; an insulating layer overlapping a first part of the first wiring line in a plan view of the stretchable wiring board; and a second wiring line overlapping the first part of the first wiring line in the plan view with the insulating layer interposed therebetween. The insulating layer has at least one first notch, and in the plan view, the at least one first notch does not overlap the first wiring line and overlaps the second wiring line.

According to the present invention, it is possible to provide the stretchable wiring board in which, when the two wiring lines are arranged so as to overlap each other, the wiring lines are prevented from being short-circuited, and meanwhile, breakage and deterioration in resistivity of the wiring lines during stretching are suppressed.

DETAILED DESCRIPTION OF THE INVENTION

Hereinafter, a stretchable wiring board of the present invention is described.

However, the present invention is not limited to the following configurations, and can be appropriately modified and applied without changing the gist of the present invention. It should be noted that a combination of two or more of the individual preferred configurations of the present invention described below is also the present invention.

Each of the embodiments shown below is an example, and partial replacement or combination of the configurations shown in different embodiments is possible. In the second and subsequent embodiments, the description of matters common to the first embodiment is omitted, and only different points are described. In particular, the same actions and effects of the same configuration are not successively described for each embodiment.

In the following description, when each embodiment is not particularly distinguished from other embodiments, it is simply referred to as "the stretchable wiring board of the present invention."

First Embodiment

Figure 1:
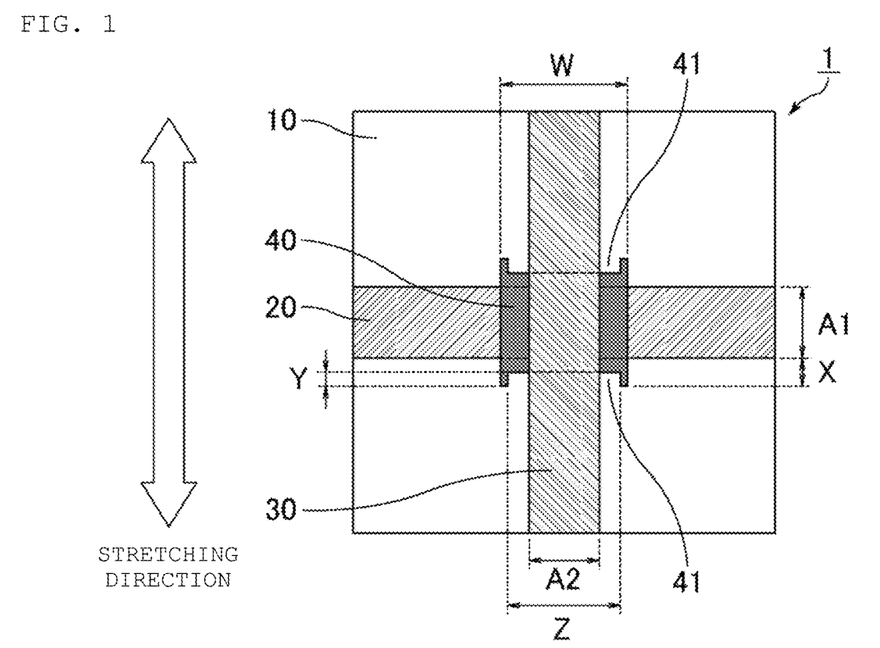
FIG. 1 is a plan view schematically showing a stretchable wiring board according to a first embodiment of the present invention.

FIG. 1 is a plan view schematically showing a stretchable wiring board according to a first embodiment of the present invention.

The stretchable wiring board 1 shown in FIG. 1 includes a stretchable substrate 10, a first wiring line 20 arranged on the stretchable substrate 10, an insulating layer 40 arranged so as to overlap a part of the first wiring line 20, and a second wiring line 30 arranged so as to overlap a part of the first wiring line 20 with the insulating layer 40 interposed therebetween.

In the stretchable wiring board 1, the first wiring line 20 and the second wiring line 30 intersect each other, and an intersecting angle is orthogonal.

The stretchable substrate 10 is made of, for example, a stretchable resin material. Examples of the resin material include thermoplastic polyurethane and others.

The thickness of the stretchable substrate 10 is not particularly limited, but is preferably 0.1 µm to 100 µm, and more preferably 0.1 µm to 1 µm, from the viewpoint of not inhibiting the stretching of the surface of the living body when the substrate is attached to the living body.

The first wiring line 20 and the second wiring line 30 preferably contain conductive particles and resin, and are preferably stretchable wiring lines. For example, a mixture composed of metal powder such as silver (Ag), copper (Cu), and nickel (Ni) as the conductive particles and an elastomer resin such as a silicone resin can be mentioned.

The average particle size of the conductive particles is not particularly limited, but is preferably 0.01 µm to 10 µm. Further, the shape of the conductive particles is preferably spherical.

The thickness of the first wiring line 20 and the second wiring line 30 is not particularly limited, but is preferably 0.01 µm to 100 µm, and more preferably 0.01 µm to 50 µm.

The line width of the first wiring line 20 (width indicated by a double-headed arrow A1 in FIG. 1) and the line width of the second wiring line 30 (width indicated by a double-headed arrow A2 in FIG. 1) are not particularly limited, but are preferably 0.1 µm to 10 mm.

The insulating layer 40 is arranged so as to overlap a part of the first wiring line 20, and the second wiring line 30 is arranged so as to overlap a part of the first wiring line 20 with the insulating layer 40 interposed therebetween. That is, the insulating layer 40 is arranged between the first wiring line 20 and the second wiring line 30 in the thickness direction, and prevents the first wiring line 20 and the second wiring line 30 from directly coming into contact with each other and causing a short circuit.

The insulating layer 40 is preferably a resin material or a mixture of a resin material and an inorganic material, and examples of the resin material include elastomer-based resins such as urethane-based, styrene-based, olefin-based, silicone-based, fluorine-based, nitrile rubber, latex rubber, vinyl chloride, ester-based, and amide-based resins, and epoxy, phenol, acrylic, polyester, imide-based, rosin, cellulose, polyethylene terephthalate-based, polyethylene naphthalate-based, and polycarbonate-based resins.

The thickness of the insulating layer 40 is not particularly limited, but is preferably 0.01 µm to 200 µm.

The insulating layer 40 has two first notches 41. The first notches 41 are provided at positions not overlapping the first wiring line 20 but overlapping the second wiring line 30 in a plan view of the stretchable wiring board 1.

Specifically, the first notches 41 are provided under the second wiring line 30 on both sides of a portion where the second wiring line 30 intersects the first wiring line 20.

The notch in the present description has a shape, in the plan view, protruding on both sides and recessed in the inside thereof. FIG. 1 shows the first notch having a recessed shape in the plan view.

In FIG. 1, the stretching directions assumed when the stretchable wiring board 1 is used are indicated by a broad double-headed arrow. This stretching direction extends along the stretching direction of the second wiring line 30.

The arrow in the stretching direction does not mean that the stretchable wiring board stretches only in this direction, but the stretchable wiring board may stretch in a direction other than the direction of the double-headed arrow.

The second wiring line 30 has stretchability, but the insulating layer 40 is often inferior in stretchability to the second wiring line 30. In such a case, when the stretchable wiring board 1 stretches, the insulating layer 40 does not extend even if the second wiring line 30 tries to extend at a portion where the second wiring line 30 is in contact with the insulating layer 40, which causes the stretching of the second wiring line 30 to be restrained by the insulating layer 40, and as a result, stress is easily applied to the second wiring line 30. Therefore, it is conceivable that the second wiring line 30 becomes broken.

Note that the stretchable wiring board of the present invention is not limited to the one in which the insulating layer is inferior in stretchability as compared with the second wiring line.

By providing the first notches 41 at the positions overlapping the second wiring line 30, the contact area between the second wiring line 30 and the insulating layer 40 in the stretching direction becomes small, and as a result, when the stretchable wiring board 1 stretches in the stretching direction, the stress applied to the second wiring line 30 is reduced, and the second wiring line 30 is prevented from being broken.

Further, because the first notches 41 are provided at the position not overlapping the first wiring line 20 in the plan view, the first wiring line 20 does not come into contact with the second wiring line 30 even when the first notches 41 are provided, and therefore, the first wiring line 20 and the second wiring line 30 are prevented from being short-circuited.

Further, in the stretchable wiring board 1, in the plan view, the first notches 41 of the insulating layer 40 are provided under the second wiring line 30 on both sides of the portion where the second wiring line 30 intersects the first wiring line 20.

By providing the first notches on both sides of the portion where the wiring lines intersect each other, the stress applied to the second wiring line on both sides of the wiring line is reduced, and therefore, the second wiring line is more reliably prevented from being broken.

Regarding the dimensions of the first notch, the depth of the first notch (the width indicated by a double-headed arrow Y in FIG. 1) relative to the width of the portion where the first wiring line does not overlap the insulating layer in the plan view (the width indicated by a double-headed arrow X in FIG. 1) is preferably 0.25 times or more, and more preferably 0.75 times or more. If the first notch is provided deep enough to satisfy this condition, the effect of reducing the stress applied to the second wiring line will be more reliably exhibited.

If the depth of the first notch is 1.00 times or more the width of the portion where the first wiring line does not overlap the insulating layer in the plan view, the first notch is too deep and the first notch overlaps the first wiring line, and the first wiring line and the second wiring line are short-circuited.

Therefore, the depth of the first notch must be less than 1.00 times the width of the portion where the first wiring line does not overlap the insulating layer in the plan view. Considering the safety in order to prevent a short circuit between the first wiring line and the second wiring line, the depth is preferably 0.90 times or less.

Further, it is preferable that the width of the first notch (the width indicated by a double-headed arrow Z in FIG. 1) be equal to or larger than the width of the wiring line (the width indicated by a double-headed arrow A2 in FIG. 1).

Further, it is preferable that the width of the first notch (the width indicated by the double-headed arrow Z in FIG. 1) be 0.99 times or less with respect to the width of the insulating layer (the width indicated by a double-headed arrow W in FIG. 1).

By satisfying the above relationship, the breakage and deterioration of resistivity of the second wiring line can be more reliably suppressed.

Regarding the Young's modulus of the first wiring line, the second wiring line, the insulating layer, and the stretchable substrate, the Young's modulus of the first wiring line and the second wiring line is preferably higher than either the Young's modulus of the insulating layer or the Young's modulus of the stretchable substrate.

When the Young's modulus satisfies the above relationship, the breakage and deterioration of resistivity of the first wiring line and the second wiring line are suppressed and meanwhile, the stretching performance can be further maintained.

Hereinafter, another embodiment of the stretchable wiring board of the present invention is described.

The same items as those described in the first embodiment are omitted, and different items are described.

Second Embodiment

In the stretchable wiring board of the present invention, in the plan view, a corner on the first wiring line side of the first notch has a round chamfered shape, and the radius of the round chamfered shape is preferably 0.01 times or more the line width of the second wiring line.

Figure 2:
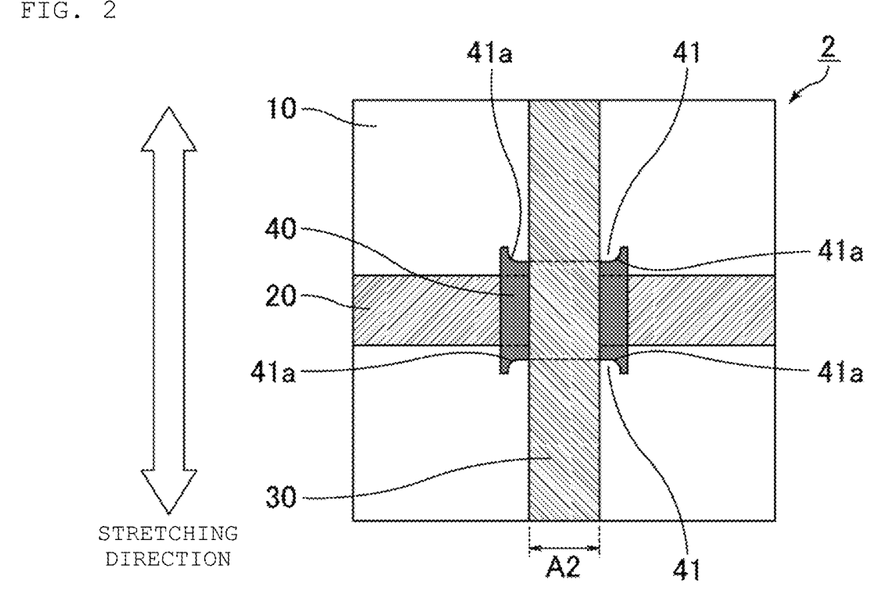
FIG. 2 is a plan view schematically showing a stretchable wiring board according to a second embodiment of the present invention.

FIG. 2 is a the plan view schematically showing a stretchable wiring board according to a second embodiment of the present invention.

In a stretchable wiring board 2 shown in FIG. 2, each corner 41a of a first notch 41 on the side of a first wiring line 20 is round chamfered.

In addition, the radius of the round chamfered part is 0.01 times or more the line width of the second wiring line (the width indicated by a double-headed arrow A2 in FIG. 2).

By providing the round chamfered part in this way, the stress applied to the second wiring line when the stretchable wiring board stretches is further reduced.

Third Embodiment

In the stretchable wiring board of the present invention, it is preferable that the insulating layer have at least one second notch and the second notch does not overlap the second wiring line but overlaps the first wiring line the plan view. Also, in the plan view, it is preferable that the second wiring line intersects the first wiring line, and the second notch of the insulating layer be provided above the first wiring line on each of both sides of a portion where the second wiring line intersects the first wiring line.

Figure 3:
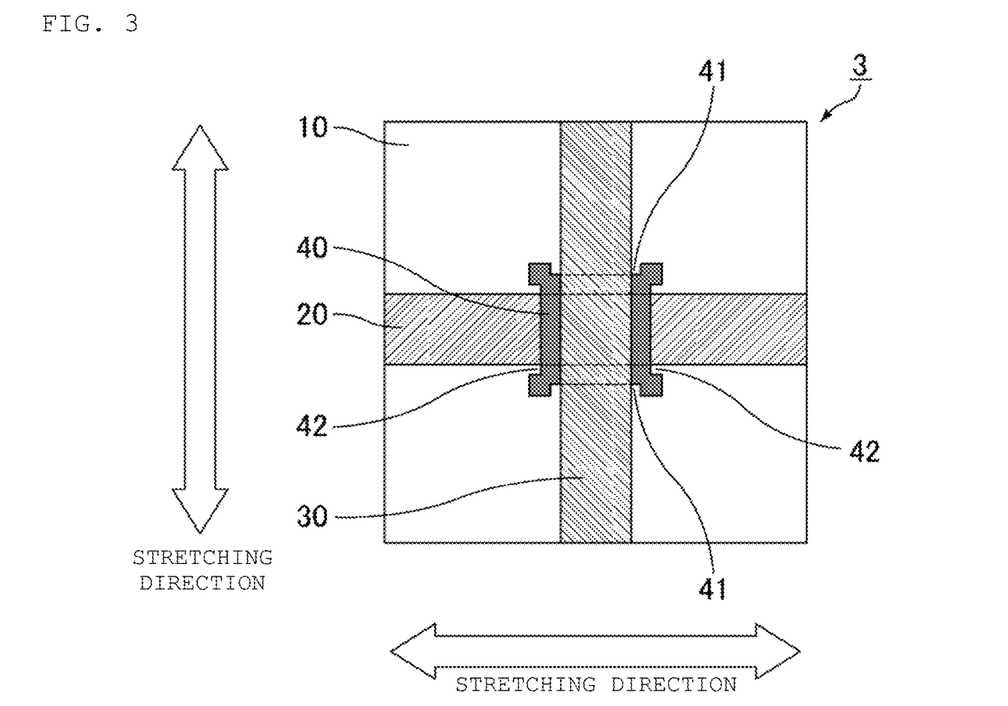
FIG. 3 is a plan view schematically showing a stretchable wiring board according to a third embodiment of the present invention.

FIG. 3 is a the plan view schematically showing a stretchable wiring board according to a third embodiment of the present invention.

In a stretchable wiring board 3 shown in FIG. 3, an insulating layer 40 is arranged so as to overlap a part of a first wiring line 20, and a second wiring line 30 is arranged so as to overlap a part of the first wiring line 20 with the insulating layer 40 interposed therebetween.

The insulating layer 40 has two first notches 41. The first notches 41 are provided at positions not overlapping the first wiring line 20 but overlapping the second wiring line 30 in the plan view.

Further, the insulating layer 40 has two second notches 42. The second notches 42 are provided at positions not overlapping the second wiring line 30 but overlapping the first wiring line 20 in the plan view.

The second notch 42 also has a recessed shape in the plan view, similarly to the shape of the first notch 41.

In FIG. 3, the stretching directions assumed when the stretchable wiring board 3 shown in FIG. 3 is used are indicated by two broad double-headed arrows. That is, both the vertical direction and the horizontal direction in the drawing are assumed as the stretching directions.

The arrow in the stretching direction does not mean that the stretchable wiring board stretches only in this direction, but the stretchable wiring board may stretch in a direction other than the direction of the double-headed arrow.

When the stretchable wiring board 3 stretches in the horizontal direction in FIG. 3, the first wiring line 20 stretches. Assuming this stretching direction, by providing the insulating layer 40 with the second notches 42, the contact area between the first wiring line 20 and the insulating layer 40 in the stretching direction becomes small, and as a result, when the stretchable wiring board 3 stretches in the horizontal direction in FIG. 3 as the stretching direction, the stress applied to the first wiring line 20 reduces, and the first wiring line 20 is prevented from being broken.

Further, because the second notches 42 are provided at the positions that does not overlap the second wiring line 30 in the plan view, the second wiring line 30 does not come into contact with the first wiring line 20 even when the second notches 42 are provided, and therefore, the second wiring line 30 and the first wiring line 20 are prevented from being short-circuited.

Further, in the stretchable wiring board 3, in the plan view, the second notches 42 of the insulating layer 40 are provided above the first wiring line 20 on both sides of the portion where the second wiring line 30 intersects the first wiring line 20.

By providing the second notches on both sides of the portion where the wiring lines intersect each other, the stress applied to the first wiring line on both sides of the wiring is reduced, and therefore, the first wiring line is more reliably prevented from being broken.

Fourth Embodiment

In the stretchable wiring board of the present invention, the notch does not have to have a recessed shape in the plan view. For example, the shape of the notch may be semicircular in the plan view or semi-elliptical in the plan view.

Figure 4:
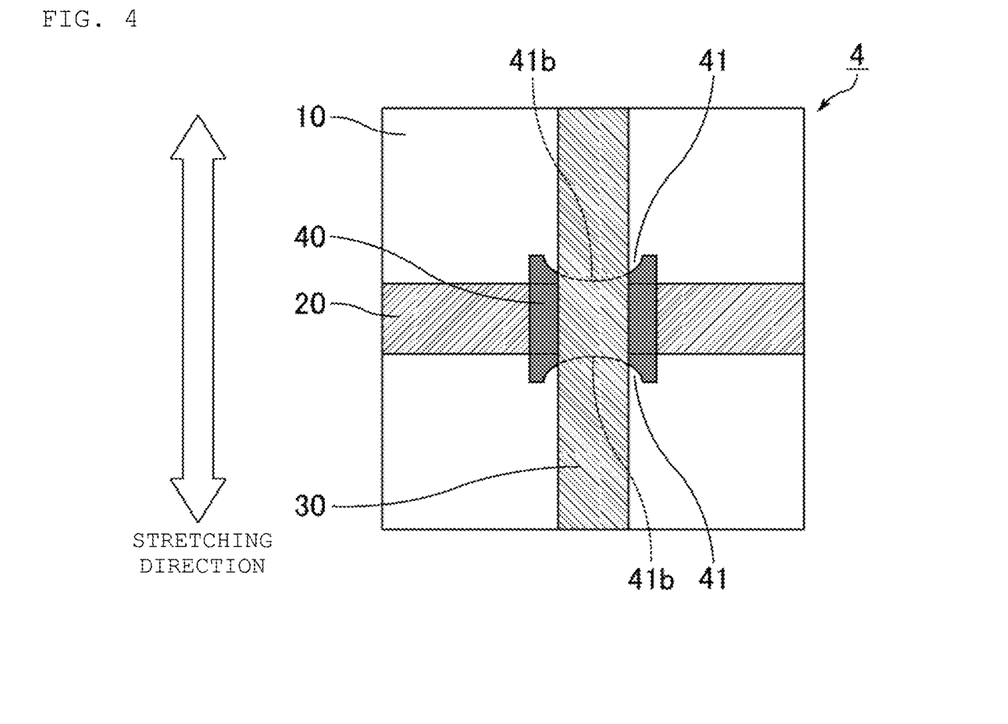
FIG. 4 is a plan view schematically showing a stretchable wiring board according to a fourth embodiment of the present invention.

FIG. 4 is a the plan view schematically showing a stretchable wiring board according to a fourth embodiment of the present invention.

In a stretchable wiring board 4 shown in FIG. 4, the shape of a first notch 41 is semi-elliptical in the plan view. Even if the first notch has the above shape, the effect of preventing the stress applied to the second wiring line is exhibited by providing the first notch.

In this case, a portion where the notch depth of the first notch 41 is deepest (portion indicated a reference numeral 41b in FIG. 4) is made not to overlap the first wiring line 20. With this configuration, the second wiring line 30 and the first wiring line 20 can be prevented from being short-circuited.

Fifth Embodiment

In the stretchable wiring board of the present invention, the angle at which the first wiring line intersects the second wiring line does not have to be orthogonal.

Figure 5:
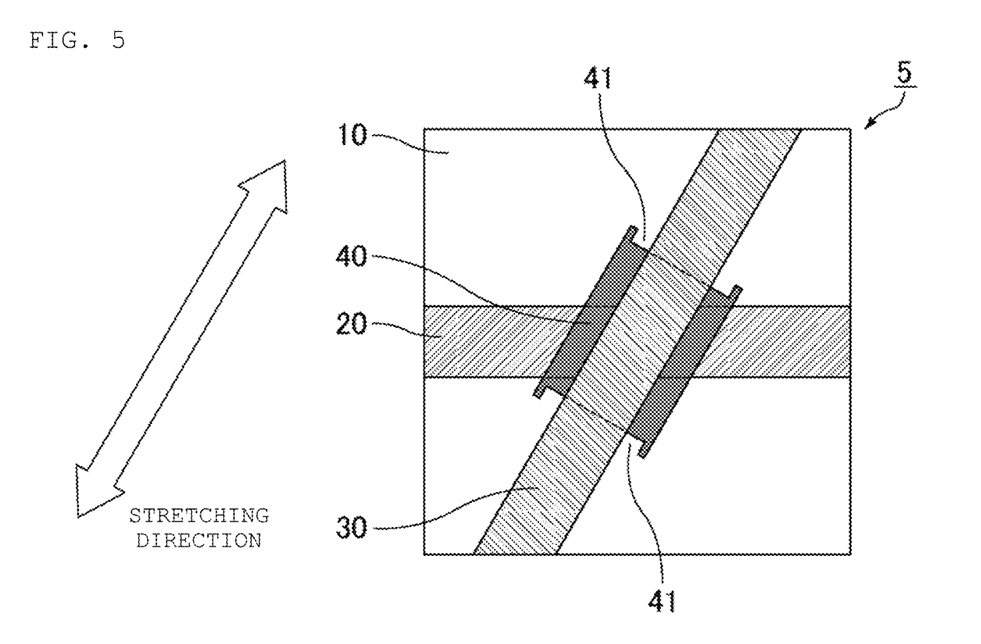
FIG. 5 is a plan view schematically showing a stretchable wiring board according to a fifth embodiment of the present invention.

FIG. 5 is a plan view schematically showing a stretchable wiring board according to a fifth embodiment of the present invention.

In a stretchable wiring board 5 shown in FIG. 5, an angle at which a first wiring line 20 intersects a second wiring line 30 is not orthogonal (90°), but the second wiring line 30 intersects the first wiring line 20 at an angle of 60°.

An insulating layer 40 is also provided along the second wiring line 30, and the long side direction of the insulating layer 40 also intersects the first wiring line 20 at an angle of 60°.

That is, the stretchable wiring board 5 of the fifth embodiment is said to have a form in which the second wiring line 30 and the insulating layer 40 of the stretchable wiring board 1 of the first embodiment are tilted together by 30°.

In FIG. 5, the stretching directions assumed when the stretchable wiring board 5 is used are indicated by a broad double-headed arrow. That is, the direction at an angle of 60° with respect to the first wiring line 20 is assumed to be the stretching direction.

The arrow in the stretching direction does not mean that the stretchable wiring board stretches only in this direction, but the stretchable wiring board may stretch in a direction other than the direction of the double-headed arrow.

First notches 41 are formed to match the stretching direction of the second wiring line 30. Similarly to the stretchable wiring board of each embodiment of the present invention described so far, also in this embodiment, by providing the first notches 41, the second wiring line 30 is prevented from being broken when the stretchable wiring board 5 stretches.

Sixth Embodiment

In the stretchable wiring board of the present invention, the angle at which the first wiring line intersects the second wiring line may not be orthogonal, and the insulating layer may not be provided along the second wiring.

Figure 6A:
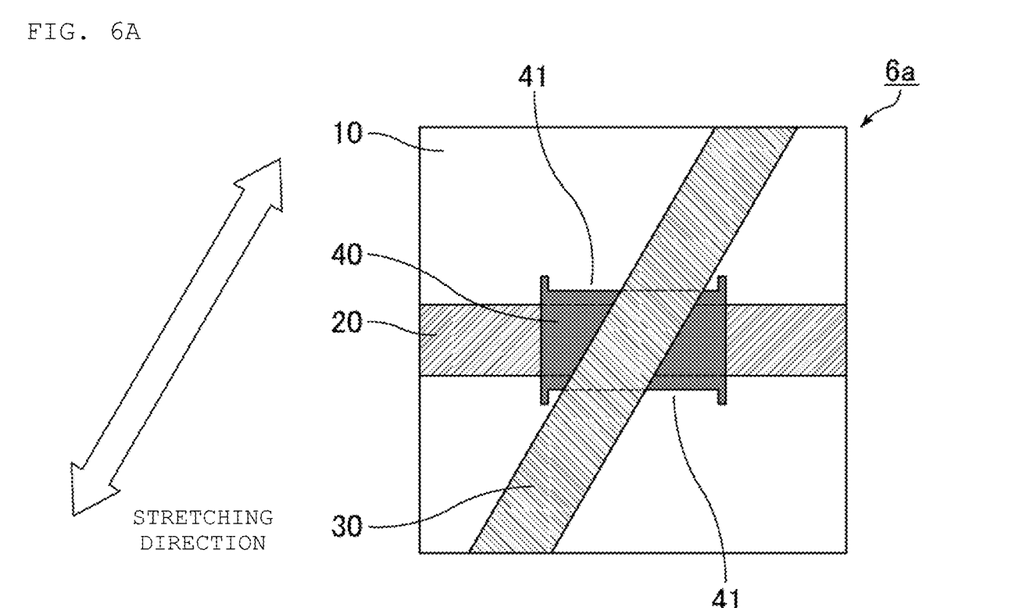
FIGS. 6A and 6B are plan views schematically showing a stretchable wiring board according to a sixth embodiment of the present invention, respectively.
Figure 6B:
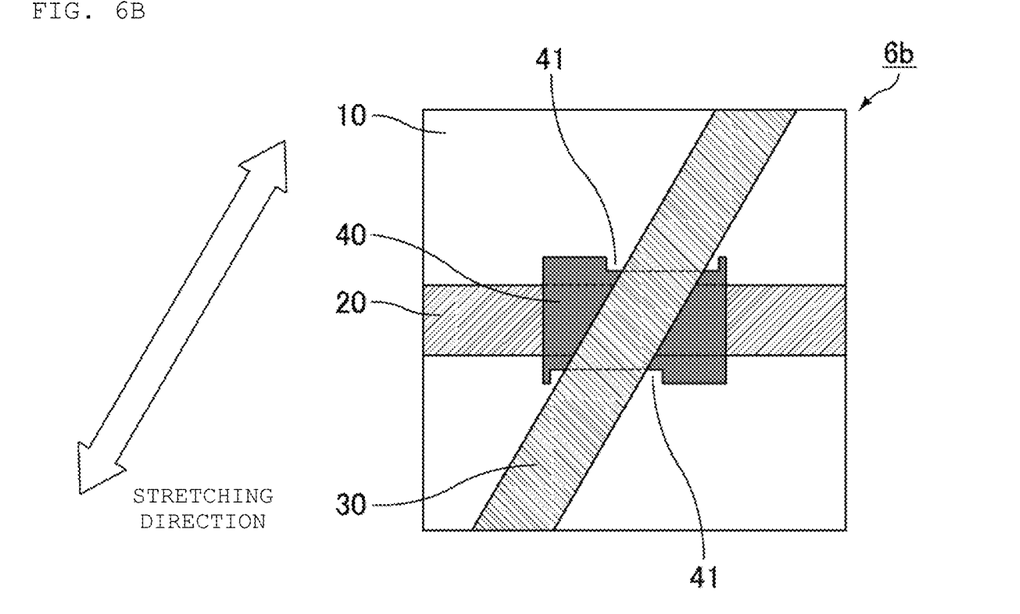

FIGS. 6A and 6B are plan views schematically showing a stretchable wiring board according to a sixth embodiment of the present invention, respectively.

The size of first notches 41 in the stretchable wiring board 6a shown in FIG. 6A is different from the size thereof in the stretchable wiring board 6b shown in FIG. 6B, but the positional relationship between the first wiring line, the second wiring line, the insulating layer, and the first notches are the same.

In the stretchable wiring board 6a shown in FIG. 6A, an angle at which the first wiring line 20 intersects the second wiring line 30 is not orthogonal (90°), but the second wiring line 30 intersects the first wiring line 20 at an angle of 60°.

The insulating layer 40 is not provided in the direction along the second wiring line 30, but the long side direction of the insulating layer 40 extends in the direction along the first wiring line 20.

In the stretchable wiring board 6a, the width of the insulating layer 40 in the horizontal direction is wider than the width in the vertical direction.

On the upper side of the insulating layer 40, the first notch 41 overlaps the second wiring line 30 on the right side, and the left side of the first notch 41 is not occupied.

On the lower side of the insulating layer 40, the first notch 41 overlaps the second wiring line 30 on the left side, and the right side of the first notch 41 is not occupied.

In the stretchable wiring board 6b shown in FIG. 6B, the width of the first notch 41 is narrowed to make the portion where the first notch 41 is not occupied in FIG. 6A is not used as the first notch, which means that the first notch 41 is formed at the minimum necessary position.

That is, on the upper side of the insulating layer 40, the first notch 41 overlaps the second wiring line 30 on the right side, and the widths of the first notch 41 are substantially the same on the left and right sides of the second wiring line 30.

On the lower side of the insulating layer 40, the first notch 41 overlaps the second wiring line 30 on the left side, and the widths of the first notch 41 are substantially the same on the left and right sides of the second wiring line 30.

Similarly to the stretchable wiring board of each embodiment of the present invention described so far, also in this embodiment, by providing the first notches 41, the second wiring line 30 is prevented from being broken when the stretchable wiring boards 6a and 6b stretch.

Figure 7:
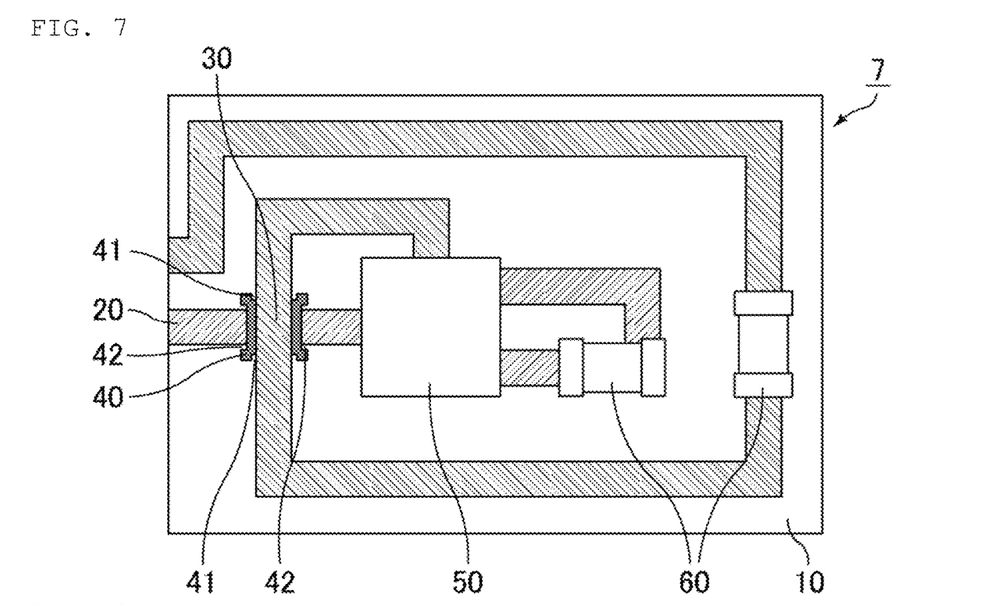
FIG. 7 is a plan view schematically showing an example of the entire device using the stretchable wiring board of the present invention.

FIG. 7 is a plan view schematically showing an example of the entire device using the stretchable wiring board of the present invention.

An electronic component can be mounted on a stretchable wiring board 7 of the present invention, and a chip component 50 and chip components 60 are mounted thereon.

A first wiring line 20 intersects a second wiring line 30, and an insulating layer 40 is provided with two first notches 41 and two second notches 42. The mode in which the first notch 41 and the second notch 42 are provided is similar to that of the stretchable wiring board 3 of the third embodiment.

Examples of the chip components include amplifiers (op amps, transistors, etc.), chip capacitors, chip resistors, and others.

The stretchable wiring board can be used as a sensor by being attached to a living body.

A biocompatible adhesive layer may be provided on the surface of the stretchable wiring board on the side not provided with the first wiring line, the insulating layer, and the second wiring line, and the adhesive layer may be used to attach the stretchable wiring board to the living body. Further, the entire stretchable wiring board may be taped and fixed to the skin.

Further, in order to prevent the first wiring line, the second wiring line, and the electronic components from coming into contact with the human body, the entire stretchable wiring board may be coated with a biocompatible resin material.

Further, in order to improve the air permeability with the skin, a structure may be formed in which the skin is easily exposed to the outside air or is easily ventilated in the region where the first wiring line, the second wiring line, and the electronic components are not arranged.

Further, the stretchable wiring boards of the respective embodiments of the present invention described so far have a form in which the first wiring line intersects the second wiring line in the plan view, but the first wiring line may not intersect the second wiring line as long as a part of the first wiring line and the second wiring line overlap each other in the plan view. For example, there is a mode in which a first wiring line extends in the horizontal direction, a U-shaped second wiring line extends in the vertical direction, and only the bottom of the U-shape overlaps the first wiring line.

In other words, the mode is said to be the one in which the second wiring line approaches from the upper side of the first wiring line extending in the horizontal direction, the second wiring line overlap the first wiring line, and the second wiring line does not leave from the lower side of the first wiring line but from the upper side of the first wiring line.

Even in the above mode, the effect of the stretchable wiring board of the present invention can be exhibited by providing notches in the insulating layer at a place where the second wiring line approaches the first wiring line and a place where the second wiring line leaves the first wiring line.

Examples

A thermoplastic polyurethane resin sheet having a thickness of 40 µm was cut into 3 mm×3 mm to form a stretchable substrate. On the stretchable substrate, the first wiring line was linearly formed with a line width of 0.5 mm and a film thickness of 25 µm using a silver paste.

An insulating layer, which is a mixture of an acrylic resin and an inorganic material, was formed with a thickness of 40 µm and a size of 0.9 mm×0.9 mm square so as to overlap a part of the first wiring line.

On the insulating layer, a second wiring line was formed with a line width of 0.5 mm and a film thickness of 25 µm using a silver paste in a direction orthogonal to the first wiring line.

The Young's modulus of the stretchable substrate was 9.9 MPa, the Young's modulus of the first wiring line and the second wiring line was 73.6 MPa, and the Young's modulus of the insulating layer was 4.63 MPa.

The stretchable wiring board arranged as described above was shaped as shown in FIG. 1, and was formed with the width A1 and the width A2 in FIG. 1 of 0.5 mm, the width W of 0.9 mm, and the width X of 0.2 mm (200 µm), respectively.

Then, test pieces formed by changing the depth Y (Y dimension) of the first notch with the width W of 0.8 mm were prepared.

For each of these test pieces, the polyurethane resin was stretched at an elongation rate of 6%, and the maximum value of the tensile stress on the surface of the second wiring line was measured.

Figure 8:
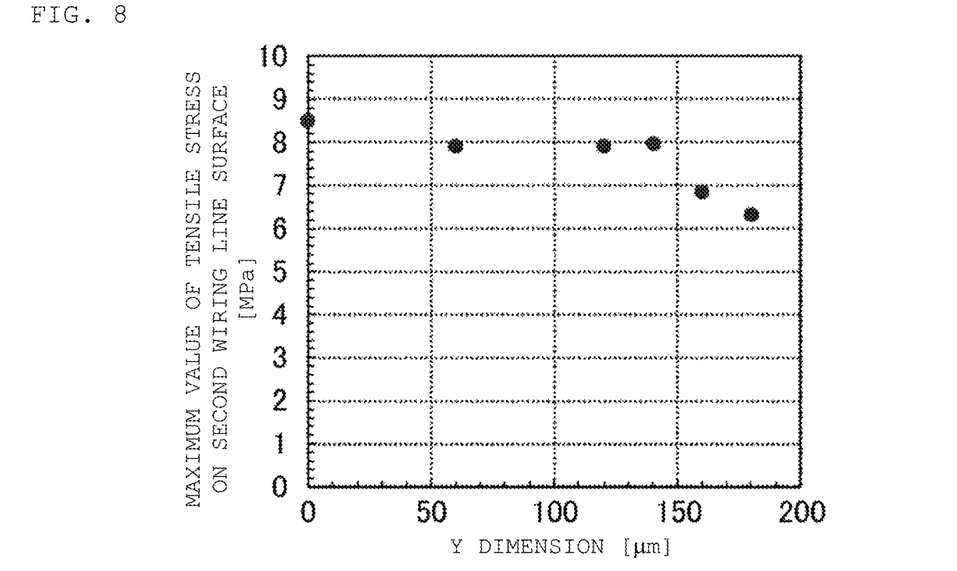
FIG. 8 is a diagram showing the relationship between the length of the Y dimension and the maximum value of tensile stress on the surface of a second wiring line.

FIG. 8 is a diagram showing the relationship between the length of the Y dimension and the maximum value of tensile stress on the surface of a second wiring line. When the Y dimension is 0 µm, it means that the first notch is not formed.

From FIG. 8, it can be seen that the tensile stress applied to the second wiring line reduces when the first notch is formed in the insulating layer. In addition, when the depth of the first notch is 0.75 times or more (150 µm or more) with respect to the width (200 µm) of the portion where the first wiring line does not overlap the insulating layer in the plan view, the tensile stress applied to the second wiring line is further reduced.

It can be seen from these results, by forming the first notch in the insulating layer, the stress applied to the second wiring line is reduced when the stretchable wiring board is stretched along the stretching direction, and the second wiring line is prevented from being broken.

Next, the result of confirming the tensile stress applied to the second wiring line in the stretchable wiring board under the conditions similar to the above embodiment by simulation is shown. The conditions were the same as for the above embodiment except that the Young's modulus of the first wiring line and the second wiring line was changed from 73.6 MPa to 9.9 MPa.

Femtet (registered trademark) manufactured by Murata Software Co., Ltd. was used as the simulation software.

This is an example in which the Young's modulus of the first wiring line and the second wiring line is the same as the Young's modulus of the stretchable substrate.

Similarly to the above embodiment, for each case when the depth Y (Y dimension) of the first notch was changed, the polyurethane resin was stretched at an elongation rate of 6% and the maximum value of the tensile stress on the surface of the second wiring line was confirmed.

Then, the maximum value of the tensile stress on the surface of the second wiring line when the length of the Y dimension was changed was confirmed as a relative value with the maximum value of the tensile stress when the Y dimension is 0 µm (Y=0) as 1.

Figure 9:
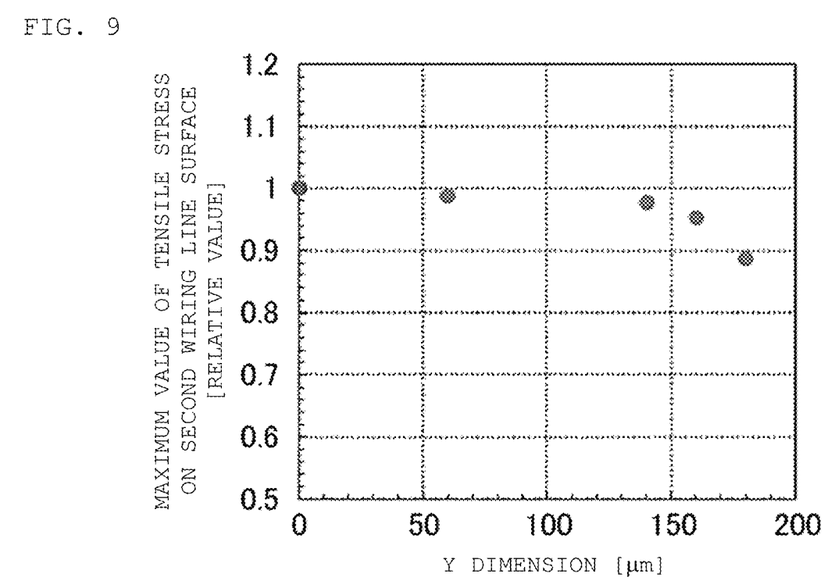
FIG. 9 is a diagram showing the relationship between the length of the Y dimension and the maximum value of tensile stress on the surface of the second wiring line when the Young's modulus of the first wiring line and the second wiring line is the same as the Young's modulus of the stretchable substrate.

The simulation results under the above conditions are shown in FIG. 9.

FIG. 9 is a diagram showing the relationship between the length of the Y dimension and the maximum value of tensile stress on the surface of the second wiring line when the Young's modulus of the first wiring line and the second wiring line is the same as the Young's modulus of the stretchable substrate.

It can be seen from FIG. 9, even in the case of the Young's modulus of the first wiring line and the second wiring line being the same as the Young's modulus of the stretchable substrate, by forming the first notch in the insulating layer, the stress applied to the second wiring line is reduced when the stretchable wiring board is stretched along the stretching direction, and the second wiring line is prevented from being broken.

DESCRIPTION OF REFERENCE SYMBOLS 1, 2, 3, 4, 5, 6a, 6b, 7: Stretchable wiring board
10: Stretchable substrate
20: First wiring line
30: Second wiring line
40: Insulating layer
41: First notch
41a: Corner of the first notch
41b: Portion where notch depth is the greatest
42: Second notch
50, 60: Chip component

The invention claimed is:

1. A stretchable wiring board comprising:
   a stretchable substrate;
   a first wiring line on the stretchable substrate;
   an insulating layer overlapping a first part of the first wiring line in a plan view of the stretchable wiring board; and
   a second wiring line overlapping the first part of the first wiring line in the plan view with the insulating layer interposed between the first wiring line and the second wiring line,
   wherein the insulating layer has at least one first notch, and in the plan view, the at least one first notch does not overlap the first wiring line and overlaps the second wiring line, and
   in the plan view, a length of the second wiring line in a longitudinal direction thereof is longer than a length of the insulating layer including the first notch along the longitudinal direction of the second wiring line.

2. The stretchable wiring board according to claim 1, wherein the second wiring line intersects the first wiring line in the plan view.

3. The stretchable wiring board according to claim 2, wherein the at least one first notch is two opposed first notches on opposed sides of a portion of the insulating layer where the second wiring line intersects the first wiring line in the plan view.

4. The stretchable wiring board according to claim 3, wherein the insulating layer has at least one second notch, and in the plan view, the at least one second notch does not overlap the second wiring line and overlaps the first wiring line.

5. The stretchable wiring board according to claim 4, wherein, in the plan view, the second wiring line intersects the first wiring line, and the at least one second notch is two opposed second notches on opposed sides of the first wiring line at the portion of the insulating layer where the second wiring line intersects the first wiring line.

6. The stretchable wiring board according to claim 1, wherein the at least one first notch has a depth of 0.25 times or more of a width at a portion where the first wiring line does not overlap the insulating layer in the plan view.

7. The stretchable wiring board according to claim 1, wherein the first wiring line and the second wiring line have a Young's modulus that is higher than either a Young's modulus of the insulating layer or a Young's modulus of the stretchable substrate.

8. The stretchable wiring board according to claim 1, wherein the insulating layer has at least one second notch, and in the plan view, the at least one second notch does not overlap the second wiring line and overlaps the first wiring line.

9. The stretchable wiring board according to claim 8, wherein, in the plan view, the second wiring line intersects the first wiring line, and the at least one second notch is two opposed second notches on opposed sides of the first wiring line at the portion of the insulating layer where the second wiring line intersects the first wiring line.

10. The stretchable wiring board according to claim 1, wherein a width of the at least one first notch is equal to or larger than a width of the second wiring line.

11. The stretchable wiring board according to claim 1, wherein a corner on a first wiring line side of the at least one first notch has a round chamfered shape.

12. The stretchable wiring board according to claim 1, wherein a shape of the notch is semicircular or semi-elliptical in the plan view.

* * * * *